United States Patent

Percival

[15] 3,665,590

[45] May 30, 1972

[54] SEMICONDUCTOR FLIP-CHIP SOLDERING METHOD

[72] Inventor: John O. Percival, Dayton, Ohio

[73] Assignee: The National Cash Register Company, Dayton, Ohio

[22] Filed: Jan. 19, 1970

[21] Appl. No.: 3,955

[52] U.S. Cl. ....................................29/494, 29/498, 29/502, 29/589

[51] Int. Cl. ....................................B23k 31/02, B23k 35/38

[58] Field of Search.....................29/494, 498, 502, 589, 590

[56] References Cited

UNITED STATES PATENTS

| | | | |
|---|---|---|---|
| 2,224,145 | 12/1940 | Dugan et al | 29/502 X |
| 3,069,766 | 12/1962 | Rush | 29/494 X |
| 3,136,032 | 6/1964 | Berndsen | 29/498 X |
| 3,409,977 | 11/1968 | Johnson | 29/589 X |
| 3,477,119 | 11/1969 | Smith | 29/498 X |
| 3,559,279 | 2/1971 | Miklaszewski | 29/589 X |

OTHER PUBLICATIONS

Brazing Manual, prepared by AWS Committee on Brazing and Soldering, 1963, pp. 55–58.

*Primary Examiner*—John F. Campbell
*Assistant Examiner*—Ronald J. Shore
*Attorney*—Louis A. Kline, John J. Callahan and John P. Tarlano

[57] ABSTRACT

The present disclosure relates to a method of reliably soldering a semiconductor flip-chip to a semiconductor flip-chip package. A hot reducing gas is passed through a reducing gas guidance device onto surface oxidized solder which is upon the electrodes of the flip-chip, to melt the surface oxidized solder and to purify the surface oxidized solder. Simultaneously, the hot reducing gas is also passed through the reducing gas guidance device onto surface oxidized solder on bonding pads of the flip-chip package, to melt this surface oxidized solder and to purify this surface oxidized solder. Due to the purification of the surface oxidized solder of the electrodes and of the bonding pads, when the solder on the electrodes and of the bonding pads is brought together, the purified solder easily coalesces together. This method produces reliable electrical connections between a semiconductor flip-chip and a semiconductor flip-chip package.

4 Claims, 2 Drawing Figures

PATENTED MAY 30 1972 3,665,590

INVENTOR
JOHN O. PERCIVAL
BY Louis A. Kline
John J. Callahan
John P. Tarlano
HIS ATTORNEYS

SEMICONDUCTOR FLIP-CHIP SOLDERING METHOD

BACKGROUND OF THE INVENTION

U.S. Pat. No. 3,340,602, which issued Sept. 12, 1967, on the application of Thomas H. Hontz, discloses a method of bonding a gold cap to a housing by pre-firing the gold cap and the housing in hot hydrogen gas, inserting a solder ring between the gold cap and the housing, and heating the gold cap, the solder ring, and the housing with an inert gas, so as to bond the gold cap to the housing. Hontz merely anneals the gold cap and the housing by means of hot hydrogen gas.

The method of the present invention involves the melting of surface oxidized solder using a hot reducing gas. The surface oxidized solder is melted and also purified of surface oxides. The purification of the surface oxidized solder is accomplished by heating it by means of a hot reducing gas. Solder upon electrodes of a semiconductor flip-chip and solder upon bonding pads of a semiconductor flip-chip package may thus be easily coalesced together, so as to form a reliable electrical connection between a semiconductor flip-chip and a semiconductor flip-chip package.

A semiconductor chip is a chip of semiconductor material upon which transistors and diodes may be formed by planar technology. The semiconductor chip may be bonded into a larger protective package by several methods. One method is to bond gold wire between each electrode of the semiconductor chip and each electrode of the protective package. Another method is to use so-called beam leads between each electrode of the semiconductor chip and each electrode of the package. A third method is to invert or flip the semiconductor chip so as to press the electrodes of the small chip against the electrodes of the protective package. Such a semiconductor chip is called a semiconductor flip-chip. Such a protective package is called a semiconductor flip-chip package.

SUMMARY OF THE INVENTION

An object of the present invention is to provide a more reliable electrical connection of a semiconductor flip-chip to a semiconductor flip-chip package.

Another object of the present invention is to provide for purification of surface oxidized solder on a semiconductor flip-chip and on a semiconductor flip-chip package by means of a hot reducing gas, at the time during which they are melted.

Another object of the present invention is to better electrically connect a semiconductor flip-chip to a semiconductor flip-chip package, by coalescing purified and melted solder on the semiconductor flip-chip to corresponding purified and melted solder on the semiconductor flip-chip package.

The present invention relates to a method of soldering a semiconductor flip-chip, having surface oxidized solder on electrodes thereof, to a semiconductor flip-chip package having surface oxidized solder on bonding pads thereof, comprising passing a hot reducing gas, having a sufficient temperature to melt the surface oxidized solder, upon said electrodes of said semiconductor flip-chip and the surface oxidized solder upon said bonding pads of said semiconductor flip-chip package, and simultaneously to purify said surface oxidized solder, and coalescing the melted and purified solder upon the electrodes of the semiconductor flip-chip to the melted and purified solder on the bonding pads of the semiconductor flip-chip package, so as to reliably electrically connect the semiconductor flip-chip to the semiconductor flip-chip package.

DESCRIPTION OF THE PREFERRED EMBODIMENT

Figure 1:
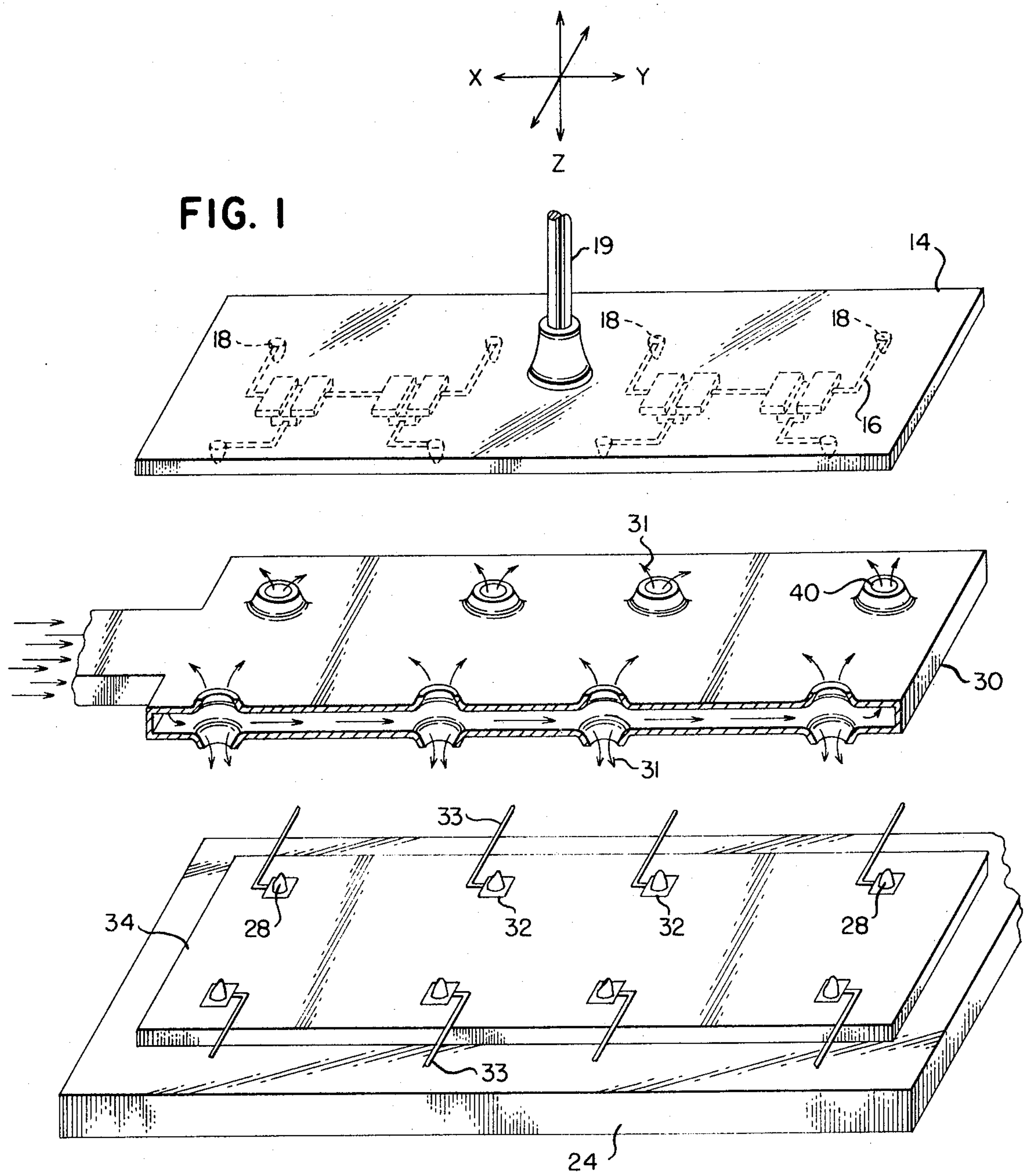
FIG. 1 is a perspective view of the method of soldering a semiconductor flip-chip to a semiconductor flip-chip package by using a hot reducing gas.

A semiconductor flip-chip 14, having electrodes 16, is shown in FIG. 1. Surface oxidized solder 18, such as surface oxidized tin-lead solder, is on the electrodes 16 of the semiconductor flip-chip 14. The semiconductor flip-chip may contain an MOS array or other integrated circuit. The semiconductor flip-chip 14 is held by an alignment rod 19, which may be moved in the XY or Z direction. A substrate 24 holds a semiconductor flip-chip package 34. The semiconductor flip-chip package 34 has leads 33, ending in bonding pads 32. Surface oxidized solder 28 is also on the bonding pads 32.

A hot reducing gas guidance device, such as a hot reducing gas guidance device 30, having jets 40, is inserted between the surface oxidized solder 18 and the surface oxidized solder 28. A hot reducing gas 31 is exited from the jets 40. The hot reducing gas 31 may be a hot hydrogen gas, a hot cracked ammonia gas, or any other gas which can reduce and melt the surface oxidized solder 18 and 28. The hot reducing gas 31 is passed through the jets 40 of the reducing gas guidance device 30, onto the surface oxidized solder 18 and 28. The hot reducing gas 31 is maintained at the melting and reducing temperature of the solder 18 and 28, such as 300° C. The hot reducing gas 31 is passed upon the solder 18 and 28 for a sufficient period, such as 15 seconds, to melt and purify the surface oxidized solder 18 and 28. Water vapor is formed during reduction of the surface oxides by means of the hot hydrogen gas.

The hot reducing gas guidance device 30 is quickly removed from between the semiconductor flip-chip 14 and the semiconductor flip-chip package 34, as during a period of 1 second. The alignment rod 19 is quickly lowered. The melted and purified solder 18 coalesces with the melted and purified solder 28. The electrodes 16 of the flip-chip 14 are thus reliably electrically connected to the bonding pads 32 of the semiconductor flip-chip package 34, due to the uniform coalescing of the purified solder 18 to the purified solder 28. The semiconductor flip-chip package 34 is thereafter removed from the substrate 24.

When oxidized tin-lead solder 18 and 28 and hot hydrogen reducing gas are used, the hot hydrogen reducing gas combines with the tin oxide and the lead oxide of the surface oxidized tin-lead solder 18 and 28, to form water vapor and melted and purified tin-lead solder 18 and 28. The hot hydrogen gas 31 may be either burning or not burning. Preferably the hot hydrogen gas 31 is not burning, so as to prevent excessive water formation upon the tin-lead solder 18 and 28, during the purifying and melting operation.

Figure 2:
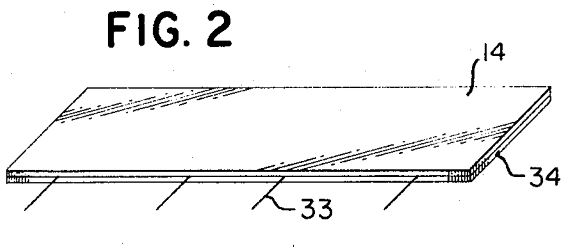
FIG. 2 is a perspective view of a semiconductor flip-chip soldered to a semiconductor flip-chip package.

FIG. 2 shows the semiconductor flip-chip 14 soldered to the semiconductor flip-chip package 34. The leads 33 extend outwardly from between the semiconductor flip-chip 14 and the semiconductor flip-chip package 34. The semiconductor flip-chip 14 is shown reliably electrically connected to a semiconductor flip-chip package.

What is claimed is:

1. A method of soldering electrodes of a semiconductor flip-chip, which has surface oxidized solder thereon, to bonding pads of a semiconductor flip-chip package, which has surface oxidized solder thereon, comprising:
   a. inserting a flat hollow hot reducing gas guidance device with openings formed therein between solder covered electrodes of a semiconductor flip-chip and solder covered bonding pads of a semiconductor flip-chip package, the openings of the hot reducing gas guidance device being aligned adjacent to said electrodes and said bonding pads to selectively direct a hot reducing gas on said solder covered electrodes and on said solder covered bonding pads;
   b. passing a hot reducing gas, having a sufficient temperature to melt the surface oxidized solder, through said hot reducing gas guidance device and through said openings, upon said solder covered electrodes of said semiconductor flip-chip and upon said solder covered bonding pads of said semiconductor flip-chip package for a selected period of time to melt said solder, and also to purify said surface oxidized solder of oxides;

c. quickly removing said hot reducing gas guidance device from between said semiconductor flip-chip and said semiconductor flip-chip package; and then d. quickly bringing together the melted and purified solder of said semiconductor flip-chip and the melted and purified solder of said semiconductor flip-chip package, so as to reliably electrically connect the semiconductor flip-chip to the semiconductor flip-chip package.

2. The method of claim 1 wherein the hot reducing gas is a hot hydrogen gas.

3. The method of claim 1 wherein the hot reducing gas is a cracked ammonia gas.

4. The method of claim 2 wherein the surface oxidized solder is surface oxidized tin-lead solder.

* * * * *